United States Patent
Panasik

(12) 
(10) Patent No.: US 6,441,703 B1
(45) Date of Patent: Aug. 27, 2002

(54) MULTIPLE FREQUENCY ACOUSTIC REFLECTOR ARRAY AND MONOLITHIC COVER FOR RESONATORS AND METHOD

(75) Inventor: Carl M. Panasik, Garland, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/484,803

(22) Filed: Jan. 18, 2000

(51) Int. Cl.[7] .............. H03H 9/54; H03H 9/56; H03H 3/007
(52) U.S. Cl. ............ 333/189; 333/191; 333/192; 29/25.35; 312/312; 312/321
(58) Field of Search .............. 333/186–192; 310/311, 312, 321, 324; 29/23.35

(56) References Cited

U.S. PATENT DOCUMENTS

| | | | |
|---|---|---|---|
| 3,568,108 A | * | 3/1971 | Poirier et al. ............ 333/187 |
| 4,166,967 A | * | 9/1979 | Benes et al. ............ 310/338 |
| 4,348,075 A | | 9/1982 | Gottlieb et al. ............ 350/96.13 |
| 4,395,702 A | | 7/1983 | Gottlieb et al. ............ 340/347 |
| 4,502,932 A | | 3/1985 | Kline et al. ............ 204/192 |
| 4,556,812 A | | 12/1985 | Kline et al. ............ 310/324 |
| 4,785,269 A | | 11/1988 | Adam et al. ............ 333/188 |
| 4,988,957 A | | 1/1991 | Thompson et al. ........ 331/107 |
| 5,075,641 A | | 12/1991 | Weber et al. ............ 331/108 |
| 5,166,646 A | | 11/1992 | Avanic et al. ............ 331/107 |
| 5,233,259 A | | 8/1993 | Krishnaswamy et al. ... 310/324 |
| 5,294,898 A | | 3/1994 | Dworsky et al. ............ 333/187 |
| 5,337,185 A | | 8/1994 | Meier et al. ............ 359/321 |
| 5,361,077 A | | 11/1994 | Weber ............ 343/846 |
| 5,367,308 A | | 11/1994 | Weber ............ 343/700 |
| 5,373,268 A | | 12/1994 | Dworsky et al. ............ 333/187 |
| 5,821,833 A | | 10/1998 | Lakin ............ 333/187 |
| 5,872,493 A | * | 2/1999 | Ella ............ 333/191 |
| 5,873,154 A | * | 2/1999 | Ylilammi et al. .......... 29/25.35 |
| 5,932,953 A | | 8/1999 | Drees et al. ............ 310/324 |
| 6,087,198 A | * | 7/2000 | Panasik ............ 438/51 |
| 6,107,721 A | * | 8/2000 | Lakin ............ 310/321 |

OTHER PUBLICATIONS

U.S. patent application Ser. No. 09/022,905 entitled "Low Cost Packaging for Thin–Film Resonators and Thin–Film Resonator–Based Filters", Feb. 12, 1998.

* cited by examiner

Primary Examiner—Robert Pascal
Assistant Examiner—Barbara Summons
(74) Attorney, Agent, or Firm—Pedro P. Hernandez; W. James Brady, III; Frederick J. Telecky, Jr.

(57) ABSTRACT

A radio frequency filter system includes a first acoustic resonator (54, 56) for a first frequency and a second acoustic resonator (54, 56) for a second frequency. An acoustic reflector array (102, 152, 202) is coupled to an electrode of the first acoustic resonator (54, 56) and to an electrode of the second acoustic resonator (54, 56). The acoustic reflector array (102, 152, 202) includes a plurality of reflector layers (112, 152, 210). A first reflector layer (112, 152, 210) is operable to reflect a signal at substantially the first frequency. A second reflector layer (112, 152, 210) is operable to reflect a signal at substantially the second frequency.

21 Claims, 3 Drawing Sheets

MULTIPLE FREQUENCY ACOUSTIC REFLECTOR ARRAY AND MONOLITHIC COVER FOR RESONATORS AND METHOD

TECHNICAL FIELD OF THE INVENTION

The present invention relates generally to the field of frequency selection elements, and more particularly to a multiple frequency acoustic reflector array and monolithic cover for resonators and method.

BACKGROUND OF THE INVENTION

Televisions and radios as well as cellular phones and other wireless devices all transmit and/or receive radio frequency signals. Televisions and radios, for example, receive programming from a number of stations in the form of radio frequency signals that are transmitted by the stations. Cellular phones and other two-way wireless communication devices communicate with a base station by both transmitting and receiving radio frequency signals. The radio frequency signals include voice traffic for a wireless telephone connection or data traffic for a wireless Internet or other network connection.

Televisions, radios, cellular phones and other wireless devices are each assigned to different radio frequencies to allow simultaneous operation of the devices within an area. Television, for example, receives signals within the 55 to 800 megahertz (MHz) range while radio receives signals within the 530 to 1,700 kilohertz (kHz) range for AM and within the 88 to 108 megahertz (MHz) range for FM. Cellular phones, in accordance with U.S. standards, operate in the 900 and 1800 megahertz (MHz) range.

Televisions, radios, cellular phones, and other wireless devices each use radio frequency filters to separate out unwanted radio frequency traffic from a desired signal, or channel. In particular, televisions and radios use a number of filters to form a tuner that allows each of the received stations to be selectively tuned. Cellular phones operate at a preset frequency range and include filters dedicated to that frequency range. In each case, the filters discriminate between signals based on frequency diversity to provide a stable signal for use by the receiving device.

Radio frequency filters based on resonators are constructed from pairs of inductors and capacitors arranged in parallel, from crystal resonators and from thin film resonators. The inductor and capacitor configuration resonates in a broad range and therefore provides low quality signal discrimination. Crystal and thin film resonators, on the other hand, resonate in a narrow range and therefore provide high quality signal discrimination.

Crystal resonators include two electrodes with a crystal positioned between them and attached to a pair of posts. The air interface provides a required low acoustic impedance for efficient internal reflection and high quality factor performance. Although crystal resonators provide high signal discrimination, they are limited to applications below 500 megahertz (MHz) due to crystal thickness limitations. As a result, crystal resonators are not suitable for cellular and other lower ultra high frequency (UHF) applications in the 300 to 3000 megahertz (MHz) range.

Thin film resonators include two electrodes with a piezoelectric layer positioned between the electrodes. The piezoelectric layer has a thickness that is an acoustic half wavelength of a target frequency of the resonator to provide resonance and thus filtering for the frequency. The thin film resonator is formed on a substrate and includes a low impedance interface for reflection which leads to efficient internal resonance. he low impedance interface may be an etched via interface, an air gap interface or replaced by a distributed acoustic reflector array. Both the etched via interface and the air gap interface use time consuming and expensive processes to form an air space between a bottom electrode and the supporting substrate. The upper electrode is left uncovered to similarly interface with air.

The distributed acoustic reflector array uses a number of alternating high and low acoustic impedance layers each having a thickness that is a quarter of the target wavelength of the target frequency to reflect back the acoustic signal from the resonator. The distributed acoustic reflector array provides reduced cost compared to the air interface methods and provides a solid support for the resonator. Because acoustic reflector arrays are wavelength specific, however, they are typically ineffective for multi-band applications in which filters of varying frequency, hence wavelength, are employed. As a result, etched via and air gap interfaces must typically be used in multi-band applications.

SUMMARY OF THE INVENTION

The present invention provides a multiple frequency acoustic reflector array for acoustic resonators and filters that substantially reduces or eliminates the disadvantages and problems associated with previously developed systems and methods. In particular, a distributed acoustic reflector array includes a plurality of disparate reflector layers that each reflect signals at different frequencies to allow multiple frequency resonators and filters to be supported by a single reflector array.

In accordance with one embodiment of the present invention, a radio frequency filter system includes a first acoustic resonator for a first frequency and a second acoustic resonator for a second frequency. An acoustic reflector array is coupled to a lower electrode of the first acoustic resonator and to a lower electrode of the second acoustic resonator. The acoustic reflector array includes a plurality of reflector layers. A first reflective layer is operable to substantially reflect a signal at substantially the first frequency while the second reflective layer is operable to reflect a signal at substantially the second frequency.

More specifically, in accordance with particular embodiments of the present invention, sets of disparate frequency layers may be included in the acoustic reflector array to provide a suitable reflection plane for each of the acoustic resonators. In another embodiment, the reflector layers may incrementally change from the first frequency to the second frequency to provide the suitable reflection plane. In both of these embodiments, the reflector layers may alternate between high and low impedance.

The technical advantages of the present invention includes providing a single-chip transceiver for a cellular phone or other device that processes radio frequency signals. In particular, a multiple band acoustic reflector array is provided to support disparate frequency filters on a single substrate. As a result, signal degradation caused by bond wires and capacitive bond pads for off-chip filters are eliminated. Thus the performance of the filter system is improved.

Another technical advantage of the present invention includes providing a distributed reflector for multiple band acoustic filters and resonators. In particular, a multi-layer acoustic reflector array is provided that reflects signals at disparate frequencies. As a result, multiple band resonators may be solidly mounted to a common underlying structure.

Thus, yield and performance are improved. In addition, fabrication costs are reduced due to the elimination of the time consuming and expensive processing required for underlying air interface structures.

Still another technical advantage of the present invention includes providing a distributed reflector cover for an acoustic resonator. In particular, an acoustic reflector array configured for the frequency of resonator is disposed over the resonator to protect the resonator from humidity and particulates. As a result, operating conditions are optimized for the acoustic resonator and performance losses due to contamination are minimized. other technical advantages of the present invention will be readily apparent to one skilled in the art from the following figures, descriptions, and claims.

BRIEF DESCRIPTION OF THE DRAWINGS

For a more complete understanding of the present invention and its advantages, reference is now made to the following description taken in conjunction with the accompanying drawings, wherein like reference numerals represent like parts, and in which.

DETAILED DESCRIPTION OF THE INVENTION

Figures 1, 2:
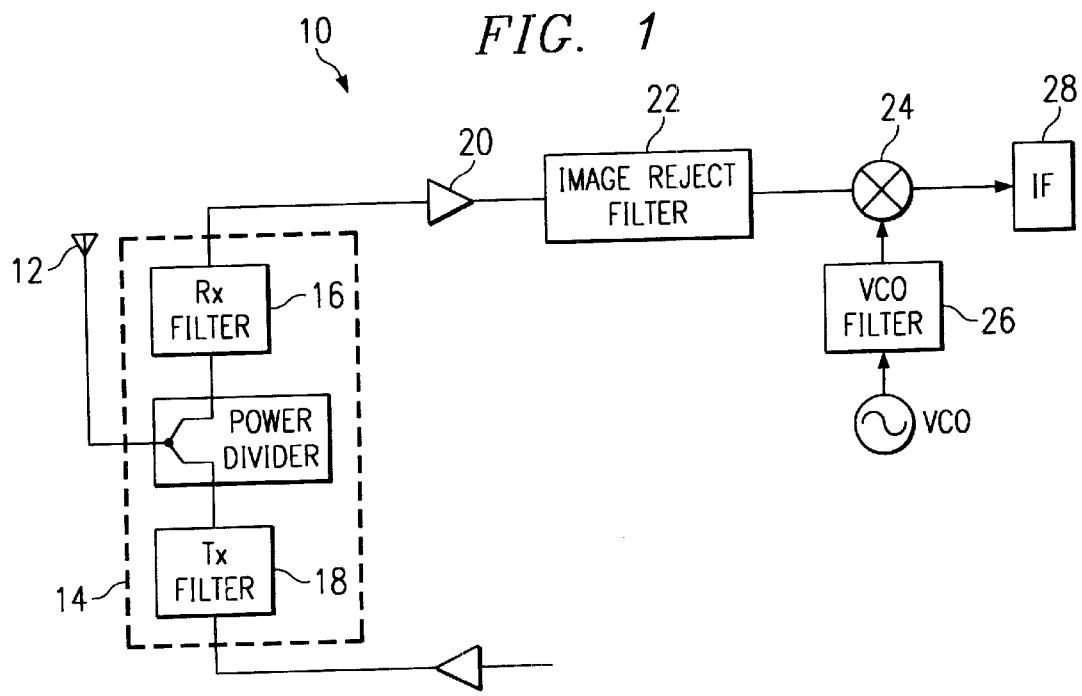
FIG. 1 is a block diagram illustrating a front end transceiver for a radio frequency device in accordance with one embodiment of the present invention.
FIG. 2 is a block diagram illustrating details of the filters of FIG. 1 in accordance with one embodiment of the present invention.

FIG. 1 illustrates a front end transceiver 10 for a wireless device in accordance with one embodiment of the present invention. In this embodiment, the wireless device is a cellular phone operated in accordance with the American standard at the 900 megahertz (MHz) range. It will be understood that the acoustic resonators and filters of the present invention may be used in connection with other types of cellular phones, wireless devices, and other suitable devices that receive, transmit and/or use radio frequency signals.

Referring to FIG. 1, the front end transceiver 10 includes an antenna 12, a diplexer 14 including a receive filter 16, a transmit filter 18, and a power divider, a low noise amplifier 20, an image rejection filter 22, a mixer 24, and a voltage controlled oscillator (VCO) filter 26. As described in more detail below, one or more of the filters 16, 18, 22 and 26 may comprise thin film resonators having low insertion loss at radio frequencies. In this embodiment, the filters 16, 18, 22 and/or 26 may be fabricated on-chip, directly onto an underlying substrate to form a single chip radio. Accordingly, signal degradation of bond wire connections and bond pad capacitance associated with off-chip filters are eliminated.

The antenna 12 sends and receives signals to and from the power divider of the diplexer 14. The diplexer 14 sends an incoming signal through the receive filter 16 which filters out television, satellite communication and radio frequencies in the cellular phone application. The transmit filter 18 filters outbound signals to be transmitted from the cellular phone to a base station. For incoming signals, the receive filter 16 passes the resulting band limited signal to the low noise amplifier 20. From the low noise amplifier 20, the signal is passed to the image rejection filter 22. The image rejection filter 22 suppresses pager, police radio and other thermal noise at the mixer 24 and local oscillator image frequency.

From the image rejection filter 22, the further bandwidth limited signal is passed to the mixer 24. The mixer 24 also receives a signal from the voltage controlled oscillator (VCO) filter 26 that is coupled to the VCO and implemented to remove synthesizer spurs. The resulting in-band signal is output to the intermediate frequency (IF) chain 28 for use by the cellular device.

For the 900 megahertz (MHz) cellular phone, the front end transceiver 10 may employ the IS-95, IS-136, or GSM standards. For the IS-95 and IS-136 standards, the receive filter 16 operates in the 869–894 MHz range, the transmit filter 18 operates in the 824–849 MHz range, the image rejection filter 22 operates in the 869–894 MHz range, and the voltage controlled oscillator filter 26 operates in the 940–965 MHz range. For the GSM standard, the receive filter 16 operates in the 935–960 MHz range, the transmit filter 18 operates in the 890–915 MHz range, the image rejection filter 22 operates in the 935–960 MHz range, and the voltage controlled oscillator filter 26 operates in the 1,006–1,031 MHz range. The receive and transmit filter 16 and 18 are each 25 MHz wide. FIG. 2 illustrates details of a filter 50 for the front end transceiver 10 in accordance with one embodiment of the present invention. In this embodiment, the filter 50 is a ladder filter comprising a plurality of suitable acoustic resonators 54 and 56. The ladder filter may be used for the receive filter 16, transmit filter 18, image rejection filter 22 and/or the voltage controlled oscillator filter 26 of the front-end receiver 10. The ladder filter 50 may also be used in television, radio, wireless, and other suitable devices that use radio frequency signals.

Referring to FIG. 2, the ladder filter 50 includes a plurality of serial resonators 54 and a plurality of parallel resonators 56. The serial resonators 54 are connected in series between an input terminal 60 and an output terminal 62 to define a series arm. The parallel resonators 56 are each respectively connected in parallel between the series arm and a ground potential to define a parallel arm.

In the ladder filter 50, the resonant frequencies of the serial resonators 54 are constructed to be coincidental with the anti-resonant frequencies of the parallel resonators 56. Thus, the ladder filter 50 comprises a pass band defined by the anti-resonant frequency of the serial resonator 54 and the resonant frequencies of the parallel resonators 56. The frequency and other properties of the individual serial and parallel resonators 54 and 56 may be varied according to the particular desired function for the filter 50.

Figure 3:
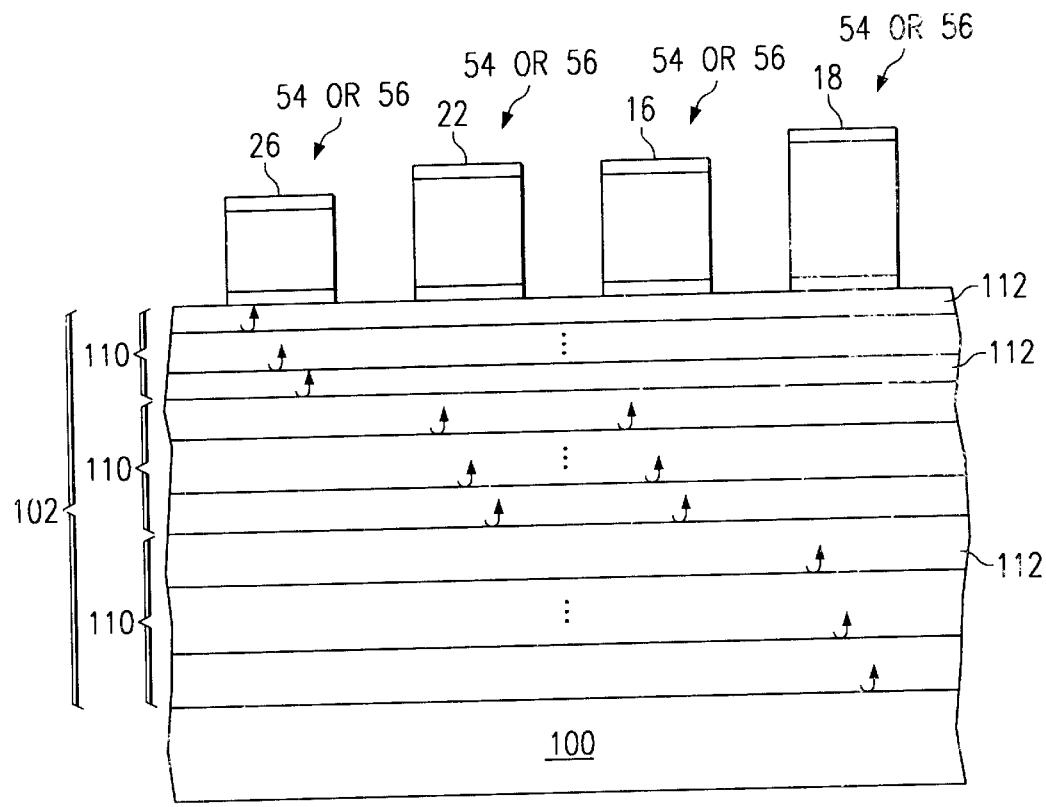
FIG. 3 is a cross-sectional diagram illustrating an acoustic reflector array for the filters of the front end transceiver of FIG. 1 in accordance with one embodiment of the present invention.

FIG. 3 is a cross-sectional diagram of the single-chip transceiver 10 in accordance with one embodiment of the present invention. In this embodiment, the receive, transmit, image rejection, and voltage controlled oscillator filters 16, 18, 22, and 26 are each implemented by one or more acoustic resonators 54 or 56. In addition, the filters 16, 18, 22, and 26 are arranged from the highest frequency to the lowest frequency. It will be understood that the filters may be otherwise suitably arranged without departing from the scope of the present invention.

Referring to FIG. 3, the single-chip transceiver 10 includes a substrate 100, and acoustic resonators formed directly on the acoustic reflector array 102. The substrate 100 comprises silicon or other suitable material. The acoustic resonators 54 or 56 may be thin film resonators fabricated as described in co-owned application Ser. No. 09/484,804, filed Jan. 18, 2000 entitled "Thin Film Resonator and Method", which is hereby incorporated by reference.

The acoustic reflector array 102 includes a plurality of sets 110 of reflector layers 112. The reflector layers 112 alternate between low and high acoustic impedance and may comprise tungston (W), silicon dioxide ($SiO_2$), silicon nitrite ($Si_3N_4$), and other materials having a suitable reflection coefficient. The reflector layers 112 of a set 110 are configured to reflect a signal at or substantially at a center or other suitable frequency of a corresponding overlying acoustic resonator 54 or 56. A reflector layer 112 is substantially configured to reflect a frequency when it is configured for that frequency or for a frequency within five percent of that frequency. The reflector layers 112 alternate between low and high acoustic impedance. In one embodiment, the frequency of the reflector layers 112 is based on their thickness. In this embodiment, the reflector layers 112 within each set 110 have a same thickness that is an acoustic quarter wavelength of a center frequency of a corresponding acoustic resonator 54 or 56. The thickness of the reflector layers 112 in different sets 110 vary to provide a distributed reflection surface for each of the resonators 54 and 56, which operate at disparate frequencies as required by their associated filters.

For the IS-95 and IS-136 900 megahertz (MHz) embodiments, the top, or first set 110 of reflector layers 112 of the acoustic reflector array 102 are an acoustic quarter wavelength of the highest center frequency required for the transceiver 10, which is the 940–965 MHz range for the voltage controlled oscillator filter 26. The second set 110 of reflector layers 112 are an acoustic quarter wavelength of the next highest center frequency for the transceiver 10, which is the 869–894 MHz range for the receive filter 16 and for the image rejection filter 22. The bottom set 110 of reflector layers 112 are an acoustic quarter wavelength of the lowest center frequency required for the transceiver 10, which is the 824–849 MHz range for the transmit filter 18. This arrangement allows low frequencies to be propagated past the thinner top reflector layers 112 without destruction as may occur with down-chirp reflective array compressor devices. The number of reflector layers 112 in each set 110 may be minimized to reduce processing and fabrication costs or maximized for ideal reflection properties for the filters 16, 18, 22, and 26. In a particular embodiment, each set 110 includes seven (7) reflector layers 112.

Figure 4:
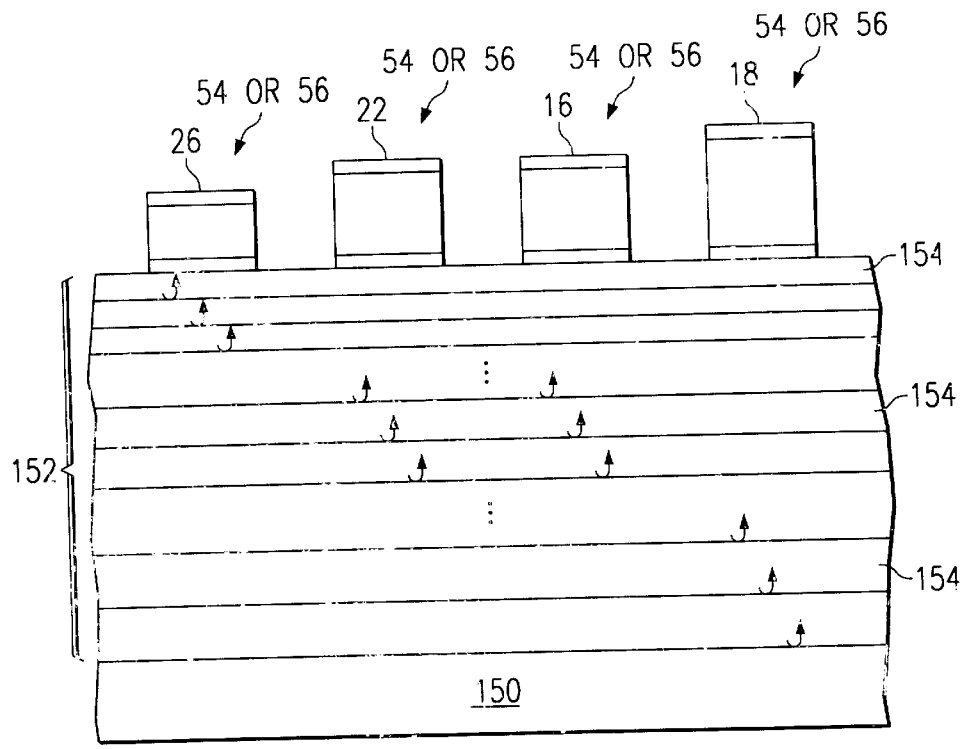
FIG. 4 is a cross-sectional diagram illustrating an acoustic reflector array for the filters of the front end transceiver of FIG. 1 in accordance with another embodiment of the present invention.

FIG. 4 is a cross-sectional diagram of the single-chip transceiver 10 in accordance with another embodiment of the present invention. In this embodiment, the receive, transmit, image rejection, and voltage control oscillation filters 16, 18, 22, and 26 may be arranged and include thin film resonators 54 and 56 as previously described in connection with FIG. 3.

Referring to FIG. 4, the single-chip transceiver 10 of this embodiment includes a substrate 150, an acoustic reflector array 152 formed on the substrate 150, and the thin film resonators 54 and 56 formed on the acoustic reflector array 152. The substrate 150 and thin film resonators 54 and 56 may be configured as previously described in connection with FIG. 3.

The acoustic reflector array 152 includes a plurality of reflector layers 154. The reflector layers 154 alternate between low and high acoustic impedance and may comprise tungston (W), silicon dioxide ($SiO_2$), silicon nitrite ($Si_3N_4$), and other materials having a suitable reflection coefficient. The reflector layers 154 each have a disparate thickness and thus reflect signals at disparate frequencies. In particular, a first or top reflector layer 154 is an acoustic quarter wavelength of the highest frequency required for any of the filters 16, 18, 22, or 26 and a last, or bottom reflector layer 154 disposed on the substrate is an acoustic quarter wavelength of the lowest frequency required for any of the filters 16, 18, 22, or 26. The intermediate reflector layers 154 are each incrementally thicker than a previous, or outward, reflector layer 154 to provide a gradual difference in reflected frequencies over the span of the acoustic reflector array 152. The increment may be linear or non-linear. Thus, the reflector stack allows the low frequencies to propagate past the thin top layers without destruction.

For the IS-95 and IS-136 900 megahertz (MHz) embodiments, the first reflector layer 154 has an acoustic quarter wavelength thickness of the 965 MHz frequency of the voltage controlled oscillator filter 26. In this embodiment, the last reflector layer 154 has a quarter wavelength thickness of the 824 MHz frequency of the transmit filter 18. The intermediate reflector layers 154 may each be incremented by four (4) to nine (9) percent. This arrangement allows low frequencies to be propagated past the thinner top reflector layers without destruction as may occur with down-chirp reflective array compressor devices. The number of reflector layers 154 may be minimized to reduce processing and fabrication costs or maximized to the reflection properties of the filters 16, 18, 22, and 26.

Figure 5:
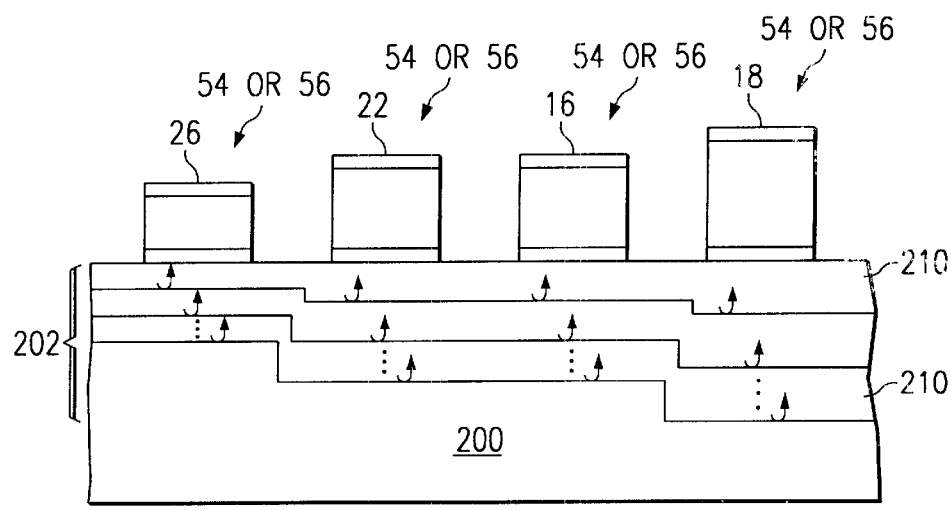
FIG. 5 is a cross-sectional diagram illustrating an acoustic reflector array for the filters of the front end transceiver of FIG. 1 in accordance with still another embodiment of the present invention.

FIG. 5 illustrates a cross-section diagram of the single-chip transceiver 10 in accordance with still another embodiment of the present invention. In this embodiment, the receive, transmit, image rejection and voltage control oscillation filters 16, 18, 22, and 26 may be arranged and include thin film resonators 54 or 56 as described in connection with FIG. 3.

Referring to FIG. 5, the single-chip transceiver 10 in this embodiment includes a substrate 200, an acoustic reflector array 202 formed on the substrate 200, and thin film resonators 54 and 56 formed on the acoustic reflector array 202. The substrate 200 and thin film resonators 54 and 56 may be configured as previously described in connection with FIG. 3.

The acoustic reflector array 202 includes a plurality of reflector layers 210. The reflector layers 210 alternate between low and high acoustic impedance and may comprise tungston (W), silicon dioxide ($SiO_2$), silicon nitrite ($Si_3N_4$), and other materials having a suitable reflection coefficient. The reflector layers 210 each comprise the same thickness at each vertical point along the transceiver 10 but increase in thickness as the frequency of the filter decreases. As used herein, each means every one of at least a subset of the identified items. Thus, the arrangement of the filters 16, 18, 22, and 26 and reflector layers 210 need to be arranged such that the thickness of the reflector layers 210 under each filter 16, 18, 22 and 26 corresponds to the frequency for its acoustic resonator 52. This embodiment substantially reduces the number of reflector layers required to support multi-band resonators but may increase fabrication cost due to the non-uniformity of the reflector layers 210.

The varied thicknesses of the layers 210 may be formed by successive pattern and etch processes. In this embodiment, the thicknesses of each of the reflector layers 210 will step up or down between disparate frequency resonators. It will be understood that the non-uniform reflector layers 210 may be otherwise suitably formed without departing from the scope of the present invention.

Figure 6:
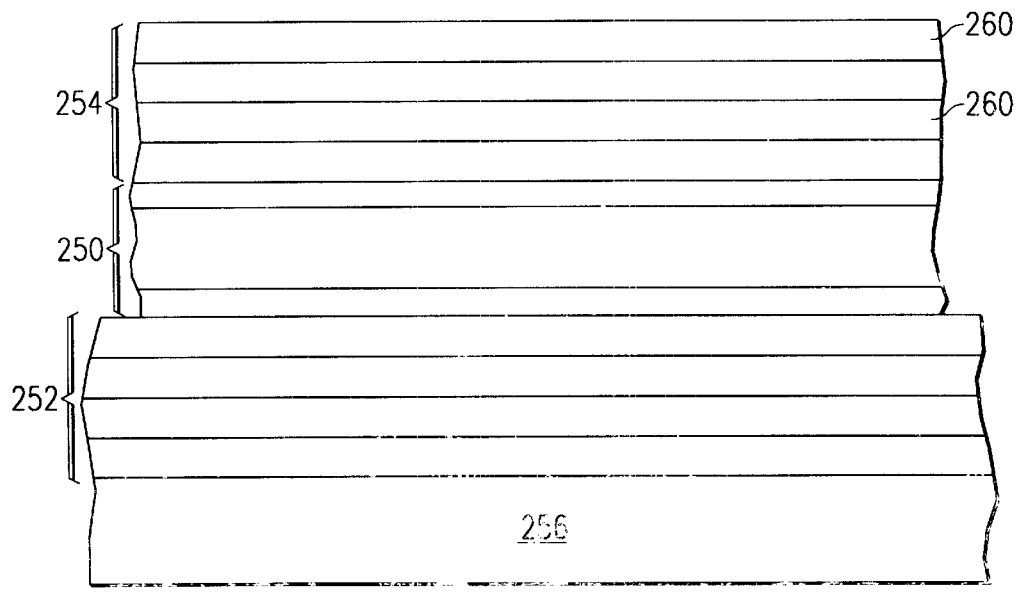
FIG. 6 is a cross-sectional diagram illustrating a monolithic cover for an acoustic filter in accordance with one embodiment of the present invention.

FIG. 6 illustrates an acoustic resonator 250 disposed between a first acoustic reflector array 252 and a second acoustic reflector array 254. The first acoustic reflector array 252 is disposed on a substrate 256 and provides a solid support for the acoustic resonator 250 as previously described in connection with FIGS. 3–5. The second acoustic reflector array 254 provides a suitable distributed reflector cover for the acoustic resonator 250. The monolithic cover protects the acoustic resonator 250 from humidity, dust and other contaminants. Thus, operating conditions are improved, failures reduced, and packaging costs are reduced as the cover eliminates the need for a hermetic package.

Referring to FIG. 6, the second, or upper acoustic reflector array 254 comprises a number of reflector layers 260 that alternate between low and high impedance that may be fabricated as previously described in connection with FIG. 3. In addition, the thicknesses of the reflector layers 260 above the acoustic resonator 250 may be varied along with that of the first, or bottom reflector array 252 as previously described in connection with FIGS. 3–5. In this way, a highly-reliable and single-chip filter system may be provided in accordance with the present invention.

Although the present invention has been described in connection with several embodiments, various changes and modifications made be suggested to one skilled in the art. It is intended that the present invention encompass such changes and modifications as follows in the scope of the appended claims.

What is claimed is:

1. A radio frequency filter system, comprising:
   a first acoustic resonator for a first frequency;
   a second acoustic resonator for a disparate second frequency that is lower than said first frequency;
   a substrate;
   an acoustic reflector array coupled between the substrate and said first and second acoustic resonators;
   the acoustic reflector array including first and second sets of reflector layers, said first set of reflector layers is stacked on top of said second set of reflector layers and is located closer to said first and second acoustic resonators than said second set of reflector layers, and said first set of reflector layers is an acoustic quarter wavelength of the first frequency and the second set of reflector layers is an acoustic quarter wavelength of the second frequency; and said first set of reflector layers is thinner in thickness than said second set of reflector layers.

2. A radio frequency filter system as defined in claim 1, wherein all of the reflector layers of the first set have substantially the same thickness and all of the reflector layers of the second set have substantially the same thickness.

3. A radio frequency filter system, comprising:
   a first acoustic resonator for a first frequency;
   a second acoustic resonator for a disparate second frequency;
   an acoustic reflector array coupled to an electrode of the first acoustic resonator and to an electrode of the second acoustic resonator; and
   the acoustic reflector array including a plurality of reflector layers, at least one of the reflector layers configured to reflect a first signal at substantially the first frequency and at least one of the reflector layers configured to reflect a second signal at substantially the second frequency and the reflector layers each reflecting a disparate frequency and incrementally changing from the first frequency to the second frequency.

4. The radio frequency filter system of claim 3, further comprising:
   a third acoustic resonator for a third frequency;
   the acoustic reflector array coupling to a first electrode of the third acoustic resonator; and
   the acoustic reflector array comprising at least one reflector layer configured to reflect a third signal at substantially the third frequency.

5. The radio frequency filter system of claim 3, wherein the first and second frequency are five or more percent apart.

6. The radio frequency filter system of claim 3, wherein the first and second frequency are ten or more percent apart.

7. The radio frequency filter system of claim 3, wherein the first and second frequency are fifteen or more percent apart.

8. The radio frequency filter system of claim 3, wherein the first reflector layer comprises a thickness of a quarter wavelength of the first frequency and the second reflector layer comprises a thickness of a quarter wavelength of the second frequency.

9. The radio frequency filter system of claim 3, the reflector layers alternating between high and low acoustic impedance.

10. A single-chip front end transceiver for a wireless device, comprising:
    a receive filter including an acoustic resonator corresponding to a first frequency of the receive filter;
    a transmit filter including an acoustic resonator corresponding to a disparate second frequency of the transmit filter;
    an image rejection filter including an acoustic resonator corresponding to the first frequency of the receive filter;
    a voltage controlled oscillator filter comprising an acoustic resonator corresponding to a disparate third frequency of the voltage controlled oscillator filter;
    an acoustic reflector array coupled to an electrode of each of the acoustic resonators; and
    the acoustic reflector array comprising a plurality of reflector layers and including a first reflective layer operable to reflect signals at substantially the first frequency, a second reflective layer operable to reflect signals at substantially the second frequency, and a third reflective layer operable to reflect signals at substantially the third frequency.

11. The single-chip front-end transceiver of claim 10, the acoustic reflector array further comprising a first set of reflector layers that are operable to substantially reflect signals at the first frequency, a second set of reflector layers that are operable to substantially reflect signals at the second frequency, and a third set of reflector layers that are operable to reflect a signal at the third frequency.

12. The single-chip front end transceiver of claim 10, each of the reflector layers operable to reflect a disparate frequency and incrementally changing between the first, second, and third frequencies.

13. The single-chip front end transceiver of claim 10, wherein the first, second, and third frequencies are together at least fifteen percent apart.

14. A method for fabricating multiple frequency filter system, comprising:

forming an acoustic reflector array including a plurality of reflector layers operable to reflect a first signal at substantially a first frequency and to reflect a second signal at substantially a disparate second frequency;

forming a first acoustic resonator for the first frequency on the acoustic reflector array;

forming a second acoustic resonator for the second frequency and coupled to the acoustic reflector array; and wherein the reflector layers are each operable to reflect a signal at a disparate frequency and incrementally change from the first frequency to the second frequency.

15. The method of claim 14, wherein the first and second frequencies are ten or more percent apart.

16. The method of claim 14, wherein the first and second frequencies are fifteen or more percent apart.

17. The method of claim 14, wherein at least one of the reflector layers comprises a thickness that is a quarter wavelength of the first frequency and at least one of reflector layers comprises a thickness that is a quarter wavelength of the second frequency.

18. The method of claim 14, wherein the reflector layers alternate between high and low acoustic impedance.

19. The method of claim 14, further comprising:

at least one of the reflector layers operable to reflect a signal at significantly a third frequency; and fabricating an acoustic resonator for the third frequency.

20. The method of claim 14, wherein the first frequency and the second frequency are five or more percent apart.

21. A single-chip front end transceiver for a wireless device, comprising:

a receive filter including an acoustic resonator corresponding to a first frequency of the receive filter;

a receive filter including an acoustic resonator corresponding to a first frequency of the receive filter;

a transmit filter including an acoustic resonator corresponding to a disparate second frequency of the transmit filter;

a voltage controlled oscillator filter comprising an acoustic resonator corresponding to a disparate third frequency of the voltage controlled oscillator filter;

an acoustic reflector array coupled to an electrode of each of the acoustic resonators;

a substrate; and the acoustic reflector array comprising a plurality of reflector layers and including a first reflective layer operable to reflect signals at substantially the first frequency, a second reflective layer operable to reflect signals at substantially the second frequency, and a third reflective layer operable to reflect signals at substantially the third frequency, the first, second and third reflective layers have different thickness and the thickest of the reflective layers is located furthest away from the acoustic resonators and the thinnest of the reflective layers is located closest to the acoustic resonators.

* * * * *